United States Patent [19]
Thakur

[11] Patent Number: 5,835,225
[45] Date of Patent: Nov. 10, 1998

[54] SURFACE PROPERTIES DETECTION BY REFLECTANCE METROLOGY

[75] Inventor: Randhir P. S. Thakur, Boise, Id.

[73] Assignee: Micron Technology, Inc., Boise, Id.

[21] Appl. No.: 890,369

[22] Filed: Jul. 14, 1997

Related U.S. Application Data

[63] Continuation-in-part of Ser. No. 813,368, Mar. 7, 1997, Pat. No. 5,783,804, which is a continuation of Ser. No. 346,764, Nov. 30, 1994, Pat. No. 5,618,461.

[51] Int. Cl.$^6$ .................................................. G01B 11/06
[52] U.S. Cl. ............................................ 356/381; 356/445
[58] Field of Search .................................... 356/381, 445, 356/448

[56] References Cited

U.S. PATENT DOCUMENTS

| | | | |
|---|---|---|---|
| 4,984,902 | 1/1991 | Crowley et al. | 374/1 |
| 4,984,903 | 1/1991 | Sweeney | 374/123 |
| 5,249,142 | 9/1993 | Shirakawa et al. | 364/557 |
| 5,337,150 | 8/1994 | Mumola | 356/382 |
| 5,364,187 | 11/1994 | Thakur et al. | 374/161 |
| 5,396,080 | 3/1995 | Hannotiau et al. | 356/381 |
| 5,490,728 | 2/1996 | Schietinger et al. | 374/7 |
| 5,564,830 | 10/1996 | Bobel et al. | 356/381 |

OTHER PUBLICATIONS

"Rapid Characterization of Polysilicon Films by Means of a UV Reflectometer," RCA Review vol. 44, Mar. (1983).

*Primary Examiner*—Frank G. Font
*Assistant Examiner*—Zandra V. Smith
*Attorney, Agent, or Firm*—Workman, Nydegger & Seeley

[57] ABSTRACT

Method and apparatus are used to determine surface properties. A reflectometer directs an electromagnetic radiation (EMR) source having a plurality of selected wavelengths to a surface of a semiconductor substrate having a known selected surface property. The quantity and variation of reflectance of EMR at each selected wavelength is measured, and a target wavelength therefrom is identified that has the highest variation of reflected EMR. EMR reflectance measurements are then made at the target wavelength on surfaces having unknown surface properties for comparison to that of the original surface. The magnitude of variation in the comparison, based upon a predetermined understanding of such variations, provide an analytical tool by which the surface is analyzed for the selected surface property. With the disclosed technique, reflectance can be used to determine characteristics of each of multiple layers that are deposited in-situ. The disclosed technique is also useful to identify both a pattern and a film on a surface, as a process end point detection tool, and in multiple points analysis on a surface using master and slave reflectometers.

23 Claims, 7 Drawing Sheets

SURFACE PROPERTIES DETECTION BY REFLECTANCE METROLOGY

This patent application is a continuation-in-part of a U.S. patent application Ser. No. 08,813,368 now U.S. Pat. No. 5,783,804, issued on Jul. 21, 1998, filed on Mar. 7, 1997, titled Reflectance Method for Accurate Process Calibration in Semiconductor Wafer Heat Treatment, which is incorporated herein by reference, and which is a continuation of U.S. patent application Ser. No. 08,346,764, filed on Nov. 30, 1994, now U.S. Pat. No. 5,618,461, issued on Apr. 8, 1997, which is also incorporated herein by reference.

THE FIELD OF THE INVENTION

This invention relates to an apparatus and method for accurately measuring surface properties using reflectance metrology. More particularly, the inventive apparatus and method uses the amplified measurement signal of reflected or refracted electromagnetic radiation, preferably ultraviolet or visible light, at a predetermined wavelength from the surface of a semiconductor substrate. The method described is ideally suited for analysis of surface properties from the measured reflectance of a surface on an object, where such analysis includes identifying both patterns and films on the surface, end point detection in the processing of the surface, analysis of multiple points on the surface for surface properties, and analysis of a feature on the surface having a sub-micron size.

BACKGROUND OF THE INVENTION

Techniques that allow for rapid and precise, nondestructive parametric measurements are in high demand in the semiconductor industry. Due to the increasing market for semiconductor devices, high volume production is a pressing requirement of semiconductor manufacturers. High volume production presents a challenge in today's technology which requires complicated designs of complex semiconductors. Particularly challenging is the quality control aspect of such high volume manufacturing. Parametric measurements become increasingly important in order to properly and accurately manufacture complex semiconductor designs. Such parameters include counts of impurities, and atmospheric factors including humidity, temperature, and pressure which can directly affect the quality of the manufactured semiconductor as well as the processing time and yield of the manufactured product.

The demands for rapid production of semiconductors adhering to strict quality control standards often involve differing objectives, all of which must be matched in order to produce a quality product at a high rate and at a relatively low price per part. Balancing these objectives is paramount in order to be competitive in the current semiconductor marketplace.

Producing semiconductor parts at an ever-increasing rate becomes increasingly important as the price per part is further reduced. Thus, advances in increasing production speed are greatly sought after. A significant amount of time is used in quality control testing during the manufacturing process, particularly where the production rate must be halted or otherwise ceased while such quality control testing takes place. It would be an advance in the art to provide such testing during the production process without halting the forward progress of the processing steps. By simultaneously conducting both manufacturing and quality control steps, the overall throughput and the production volume rate are enhanced. Parametric measurement techniques which can be used during production steps are thus desirable.

Manufacturing and quality control steps which are desirable may also be difficult to accomplish. Particularly, it is difficult to non-destructively test a surface of a semiconductor substrate to identify both a pattern and a film thereon at various points on the surface. It is also difficult to accurately detect the end point of a fabrication process that properly produces a surface on a semiconductor substrate having desirable surface properties. Also, as feature sizes decrease to meet miniaturization demands, new ideas for surface properties monitoring during semiconductor device fabrication must also be found for even smaller features.

It is desirable to have real time, in-line monitoring of surface properties during semiconductor device fabrication that is non-destructive and that will be effective as to ever decreasing feature sizes.

SUMMARY OF THE INVENTION

Additional advantages of the invention will be set forth in the description which follows, and in part will be obvious from the description, or may be learned by the practice of the invention. The advantages of the invention may be realized and obtained by means of the instruments and combinations particularly pointed out in the appended claims.

In accordance with the invention as embodied and broadly described herein, a method and an apparatus each use an inventive reflectance measurement technique (IRMT). The IRMT is a nondestructive product level calibration method which is based on reflectance of intensity of electromagnetic radiation (EMR) that is measured from a surface of a semiconductor substrate. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above.

The IRMT is used to determine a particular surface property of a surface on a semiconductor substrate. The surface can be either substantially planar and therefore have a reflection therefrom that is specular in nature, or the surface can be substantially patterned and therefore have a reflection therefrom that is diffuse in nature.

The IRMT is accomplished by directing an EMR source having a plurality of selected wavelengths to a surface of a semiconductor substrate that is known to have a selected surface property. A measurement is made of the quantity and variation thereof of EMR at each of the predetermined wavelengths that is reflected off the surface having the selected surface property. A determination is made as to a wavelength from among the plurality of selected wavelengths at which the variation of the quantity of reflected EMR off the surface is the highest variation. The wavelength having the highest variation will be chosen to be the target wavelength for the IRMT. Stated otherwise, EMR having a wavelength with highest change in reflectance will be chosen to be the target wavelength. At the target wavelength, a target measured quantity of reflected EMR is noted for the surface of the semiconductor substrate having the known selected surface property.

The IRMT then makes EMR reflectance measurements substantially at the target wavelength on surfaces for which surface properties are unknown. Such EMR reflectance measurements at the target wavelength are compared with the target measured quantity of reflected EMR. The magnitude of variation in the comparison, based upon a predetermined understanding of such variations, will provide an analytical tool by which the surface will be analyzed for the selected surface property.

The IRMT can be used in a variety of applications, including reflectance measurements to identify both a pattern and a film on a surface of a semiconductor substrate. With the IRMT, reflectance can be used to determine characteristics of each of multiple layers that are deposited in-situ. The IRMT is also useful in end point detection of a fabrication process being performed in order to achieve a certain surface property on a surface of a semiconductor substrate. Multiple points on the surface can be analyzed for reflectance data with the IRMT, both individually and simultaneously, using master and slave reflectometers that collect the data for the surface so that surface characteristics across the surface can be determined.

Semiconductor device circuitry fabrication is assisted by the IRMT using reflectometers, such as during the course of fabrication of dynamic random access memory (DRAM) devices and container cell capacitor devices associated with DRAM devices.

The IRMT can be used to measure features of various sizes limited only by the diameter of EMR that irradiates an area on a surface of a semiconductor substrate. As such, surface property analysis of small feature sizes to assess both surface roughness and individual material grain size characteristics are contemplated uses for the IRMT.

It is contemplated that the IRMT as taught herein can used with a variety of EMR spectrum, known and yet to be known, in order to measure a desired surface property of a surface on a semiconductor substrate. Such uses of EMR are limited substantially only to EMR that will reflect or will refract at a selected most sensitive wavelength, respectively, from or through a given material being subjected to the IRMT. As an extension of the quantum mechanic principles of the duality of light and characteristics thereof as both a particle and a wave, uses of the IRMT are contemplated using EMR that is required to monitor the fabrication of atomic sized device features.

If the IRMT is to be accurate for measurements on different surfaces, the surfaces must be similar in material and geometry. The closer that the parameters of materials and geometry correspond between surfaces, the more accurately the IRMT will correspond to other surfaces.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Advantages of the present invention will become readily apparent to those skilled in the art to which the invention pertains from the following detailed description, wherein preferred embodiments of the invention are shown and described in the disclosure by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

Reference will now be made to the drawings wherein like structures will be provided with like reference designations. It is to be understood that the drawings are diagrammatic and schematic representations of the embodiment of the present invention and are not drawn to scale.

Figure 1:
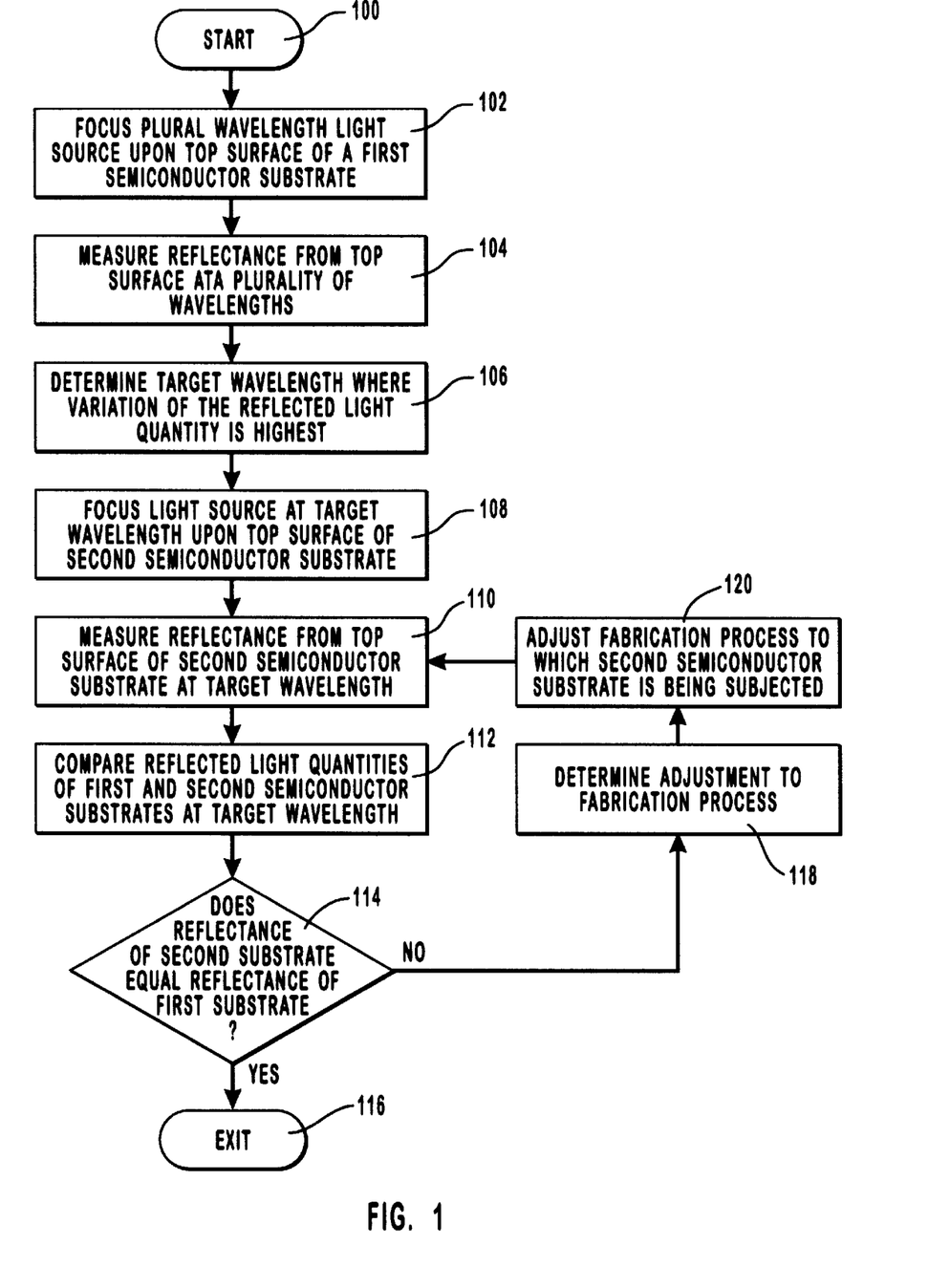
FIG. 1 is a block diagram showing various manipulative steps of a method incorporating the inventive reflectance measurement technique (IRMT) that is a nondestructive product level calibration method based on reflectance of intensity of electromagnetic radiation (EMR) at a target wavelength that is measured from a surface of a semiconductor substrate having a known surface property, and which is then compared for reflectance quantities of EMR at the target wavelength from a surface of another semiconductor substrate having surface properties that are unknown.

FIG. 1 is a block diagram of an end point detection method incorporating the inventive reflectance measurement technique (IRMT). The IRMT is directed to making reflectance measurements using a surface of a semiconductor substrate so as to ascertain when a process being performed upon the surface to achieve a desired surface property is at the preferred end point.

After system initialization at step 100, step 102 begins where a source for electromagnetic radiation (EMR) is focused upon a surface of a first semiconductor substrate that has a known surface property. The EMR has a plurality of predetermined wavelengths over which reflectance measurements are to be made. In step 104, such measurements are taken of the variation in the quantity of EMR at each of the predetermined wavelengths that is reflected off the surface of the first semiconductor substrate from the EMR source.

At step 106, a target wavelength is identified from among the plurality of predetermined wavelengths and is that wavelength at which the variation of the quantity of reflected EMR off the surface of the first semiconductor substrate is the highest variation. Additionally, a target quantity range of reflected EMR for the target wavelength is noted.

In step 108, a EMR source of the target wavelength is focused on a surface of a second semiconductor substrate. Unlike the surface of the first semiconductor substrate, the surface of the second semiconductor substrate has surface properties that are unknown. Step 110 calls for measuring the quantity of EMR at the target wavelength that is reflected off the surface of the second semiconductor substrate. It is intended that the EMR source can be focused on the second semiconductor substrate even when such surface is undergoing a fabrication process, such as deposition, etching, heat treatment from the heat source, and equivalents.

In step 112, a comparison is made between the reflectance of EMR at the target wavelength off the surface of the second semiconductor substrate and the target quantity range of reflected EMR. In step 114, a query is made as to whether the reflectance off the second semiconductor substrate is within a predetermined acceptable target quantity range of reflected EMR. If so, then the fabrication process to which the second semiconductor substrate is being subjected will terminate at step 116. However, if the reflectance quantity at the target wavelength for surface of the second semiconductor substrate is not within the target quantity range of reflected EMR, then the process moves to step 118 in which a determination is made as to a required adjustment to the fabrication process to which the second semiconductor substrate is being subjected. In step 120, the determined adjustment is made to the fabrication process so as to better control the achievement of the desired surface property of the second semiconductor substrate. After the adjustment to the fabrication process, the method returns to step 110 to again measure the reflected EMR at the target wavelength from the surface of the second semiconductor substrate.

The process moves between steps 110 and 120 until the reflectance of EMR at the target wavelength from the surface of the second semiconductor substrate is within that of the target quantity range of reflected EMR from the surface of the first semiconductor substrate. In this way, a closed loop process for achieving a desired surface property of the surface on the second semiconductor substrate is controlled. Of course, other semiconductor substrates can be tested and compared to the target quantity range of reflected EMR at the target wavelength in a continuum of semiconductor substrate fabrication processing. Additionally, the particular order of the steps to be performed can be rearranged, and such rearranged steps are contemplated as being within the scope of the invention.

Figure 2:
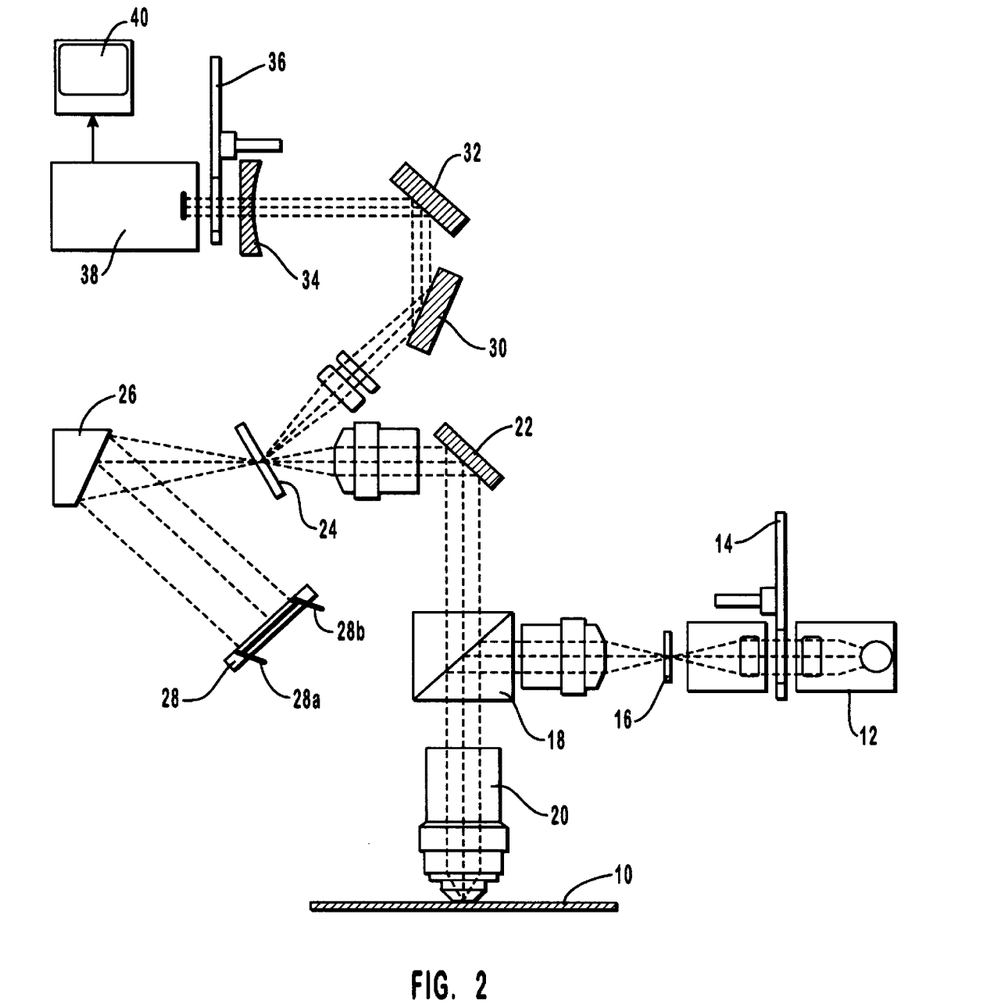
FIG. 2 is a depiction of a possible physical embodiment of practicing the invention in which an reflectometer is used to take reflectance readings from a surface on a semiconductor substrate.

Depicted in FIG. 2 is a preferred physical embodiment of practicing the invention. The apparatus seen in FIG. 2 shows an optical path of a measurement instrument that is used to take reflectance readings. The measurement instrument may be used in situ for RTP environments.

In FIG. 2, a semiconductor substrate 10 is subjected to radiation. An optical path is initiated at a means for generating radiation, which by example and illustration is a lamp 12. From lamp 12, the optical path is routed to a wavelength filter 14 so that the optical path is followed by radiation of a preselected range of wavelengths. After wavelength filter 14, the optical path is focused upon and passes through a field stop 16 to beam splitter 18. Beam splitter 18 splits the radiation in the optical path by transmitting the optical beam to objective lens 20. The radiation in the optical path passes through objective lens 20 to cause an incident radiation beam at the preselected range of wavelengths upon semiconductor substrate 10.

Incident radiation upon semiconductor substrate 10 is reflected off the surface thereof so that the radiation reflected therefrom is routed back to beam splitter 18. The reflected radiation travels along the optical path through beam splitter 18 to be reflected off mirror 22. The radiation off mirror 22 is bifurcated at an aperture plate 24 into dual optical paths.

The first optical path is directed towards a grating 26 and from thence to a solid-state radiation detector 28. Solid-state detector 28 has a 800 nanometer detection component 28a at one end thereof, and a 400 nanometer detection component 28b at an opposite end thereof. At solid-state detector 28, the reflectance of the radiation is measured.

The second optical path from aperture plate 24 is reflected to a mirror 30 for further reflection to another mirror 32, and from thence to projection lens 34. The radiation in the optical path then passes through both a projection lens 34 and a neutral density filter wheel 36. Neutral density filter wheel 36 further directs the radiation in the optical path to a camera 38 for transmission to a color monitor as indicated by block 40 in FIG. 2. The color monitor serves as an approximate visual representation of the reflectance measurements taken by solid-state detector 28.

Figure 3:
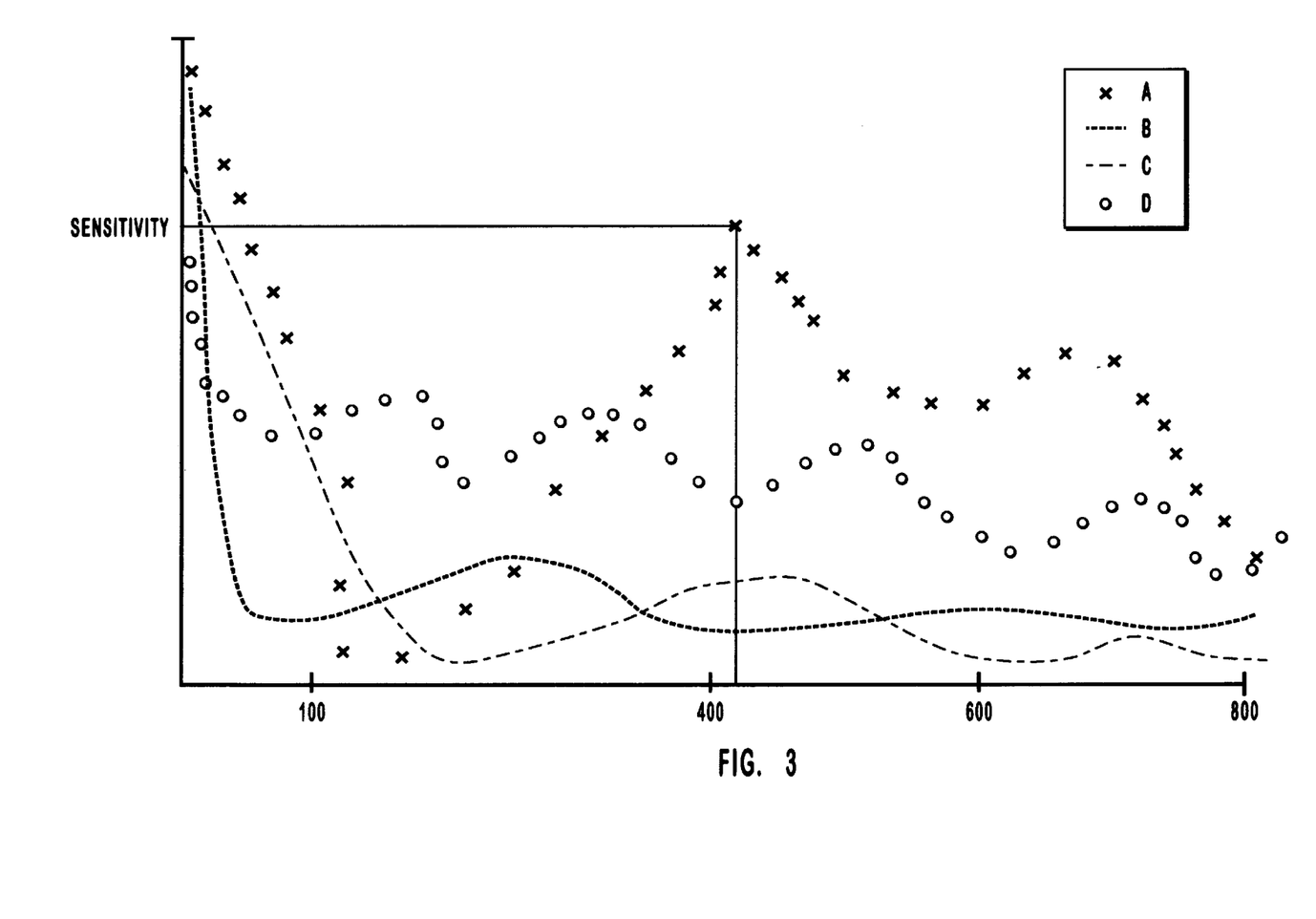
FIG. 3 is a graph of the sensitivity of reflectance for a plurality of wavelengths, where the sensitivity is the change in reflectance of electromagnetic radiation that is measured for a surface of a semiconductor substrate, and where reflectance is the ratio of reflected radiation divided by incident radiation for each of the plurality of wavelengths.

FIG. 3 is a graph for parts A, B, C, and D showing the sensitivity of reflectance for a plurality of wavelengths. Sensitivity is measured as the change in the quantity of reflected electromagnetic radiation from a surface of each of parts A, B, C, and D. Reflectance is the ratio of reflected electromagnetic radiation divided by incident radiation electromagnetic for each of wavelengths A, B, C, and D. FIG. 3 shows that, for part A, the most sensitive wavelength is about 406 nanometers.

Figure 4:
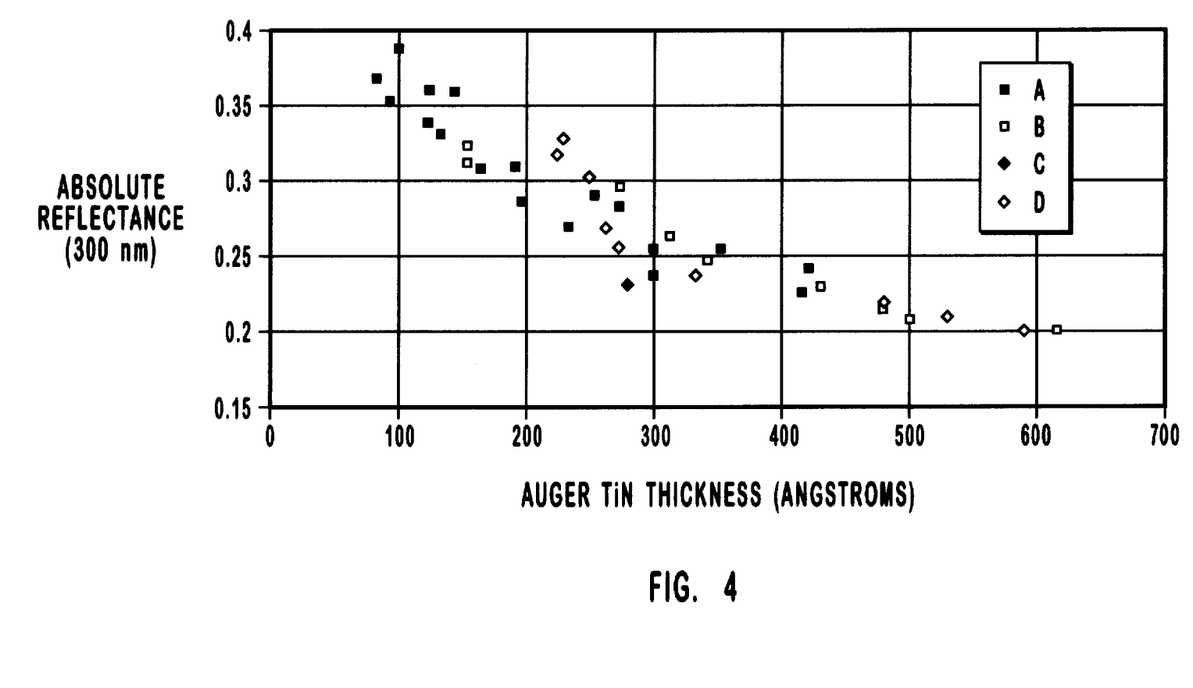
FIG. 4 is a graph of reflectance at a known most sensitive wavelength versus the thickness of an Auger TiN Film.

FIG. 4 shows a graph for parts A, B, C, and D of reflectance versus Auger TiN film thickness. Reflectance is measured as a ratio of reflected radiation divided by incident radiation for radiation having at a wavelength of approximately 300 nanometers, where 300 nanometers is the most sensitive wavelength for a given surface on an Auger TiN film. Auger TiN film thickness is measured in angstroms. FIG. 4 depicts the relationship that Auger TiN film thickness is inversely proportional to reflectance at 300 nanometers.

The IRMT can be used in a variety of specific applications that are particularly related to semiconductor device fabrication. While incorporated as an integral monitoring component of a semiconductor device fabrication process, the IRMT can be used to identify both patterns and films on a surface of a semiconductor substrate.

In pattern identification uses of the IRMT, a reflectometer makes reflectance measurements which are analyzed to identify a particular pattern on a surface of a semiconductor substrate. To do so, reflectance measurements are taken at a predetermined target wavelength of a surface of a semiconductor substrate about which the pattern in unknown. These reflectance measurements are compared to a database of pre-calibrated data taken from a surface of a semiconductor substrate having a known pattern on the surface or a known surface on the pattern. A computer processes the reflectance measurements against the database of pre-calibrated data to identify by the comparison variations from the known pattern. For example, a reflectometer is operated using the IRMT to detect reflectance in certain locations upon a surface of the semiconductor substrate where both silicon and oxide are present. The reflectance data collected by the reflectometer are analyzed to identify the pattern into which these materials have been formed.

It is also contemplated that the IRMT can be used to identify both film types and the processing that has taken place on the film type. In this application, a reflectometer makes reflectance measurements which are analyzed to identify a particular film on a surface of a semiconductor substrate. To do so, reflectance measurements are taken and compared to a database of pre-calibrated data similar to that described above. A computer processes the reflectance measurements against the database of pre-calibrated data to identify therefrom a film on the surface of the semiconductor substrate. Once the film has been identified, various characteristics of the film can also be identified, such as the heat treatment status thereof, or an identification of the processing to which the film has been exposed based on the reflectance data detected by the reflectometer. With the IRMT, reflectance can be used to determine characteristics of each of multiple layers that are deposited in-situ.

Semiconductor fabrication processing is improved with accurate end point detection for a given fabrication process. End point detection is desirable for processes such as film deposition, and processes for removing film such as chemical mechanical planarizing (CMP) of a spin on glass material, and etching. It is proposed to use the IRMT to determine when a process, such as any of the foregoing processes, has progressed to a desired end point. To do so, a reflectance characteristic is identified at a most sensitive wavelength for a particular process and surface being analyzed. This data is kept as a bench mark against which other surfaces of semiconductor substrates will be compared as the process is performed upon subsequent surfaces of semiconductor substrates. When reflectance from a surface of a semiconductor substrate matches the bench mark data, the process is at its end point for the surface of the semiconductor substrate being processed.

By way of example of end point detection during a fabrication process, reflectance data are measured by a reflectometer, for example, at multiple points on a surface of a semiconductor substrate using the IRMT. The detected reflectance at each such point is compared to bench mark reflectance standards to determine any variation therefrom. If there is no variation, the end point has been detected. Variations indicate deviations from uniformity desired to be achieved in the fabrication process. Measurements are made in real time with in-line measurement equipment in order to assess the uniformity of a surface property desired to be achieved by the fabrication process.

Multiple detectors of reflectance can be used to collect reflectance data for a surface. It is advantageous to use a master detector and one or more slave detectors to study reflectance characteristics, using the IRMT, across a surface. For example, films are patterned on a surface of a semiconductor substrate by a blanket deposition, a planarization, and/or an etch. The master detector receives reflectivity data in the form of signals from slave detectors focused in multiple points across the surface of the semiconductor substrate. The master detector compares the signals to standard bench mark signals to determine how a given process is progressing relative to variations from the bench mark signals. Any slave signal variation from target reflectance quantities at a target wavelength is an indicator of the variation in the surface properties and in the process itself. The slave detectors communicate signals which are processed in a feed back loop in communication with the master detector. The feed back loop may in turn induce an adjustment in the fabrication process. For example, if a surface of a semiconductor substrate is being planarized, the reflectivity data accumulated by the master detector may, through the feed back loop, induce the planarization tool to undergo certain adjustments, such as a cessation of the planarizing operation.

Figure 5:
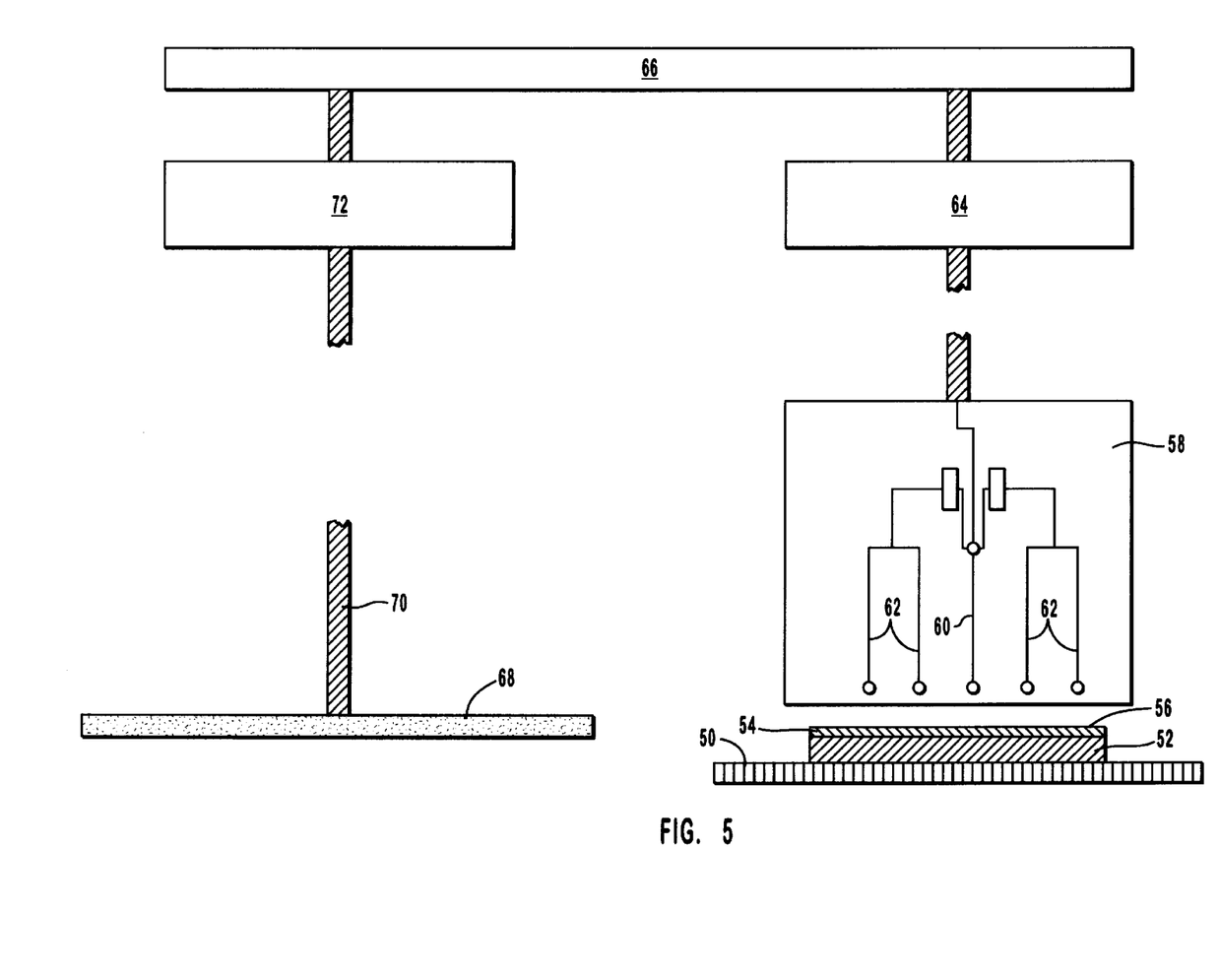
FIG. 5 is a cross sectional elevation view showing a surface of a semiconductor substrate that is being subjected by a planarizing tool to a process of global planarization in a depiction of a possible physical embodiment of practicing the invention, and also showing slave reflectometers in communication with a master reflectometer that is associated with control logic for operating the planarizing tool, where the slave reflectometers with the master reflectometer are used together to take simultaneous reflectance readings at multiple points on the surface of the semiconductor substrate to detect the thickness of the material being removed by the global planarization process and to make adjustments to the planarizing tool via the control logic in response to the simultaneous reflectance readings.

FIG. 5 depicts a practical application of the foregoing planarizing processing using an abrasive polishing tool. Such abrasive polishing tools are typically used in chemical-mechanical planarization. A platen 50 has situated thereon a semiconductor substrate 52. Semiconductor substrate 52 has a film 54 thereon. Surface 56 on film 54 is to be planarized by the abrasive planarizing tool depicted in FIG. 5.

A reflectometer housing 58 contains therein a master reflectometer 60, associated with a plurality of slave reflectometers 62. Reflectivity data as to the reflectance of electromagnetic radiation from top surface 56 of film 54 is received by master and slave reflectometer 60, 62. Such reflectance data is communicated to a reflectometer control circuit housing 64 for the purpose of further processing. A planarizing tool shuttle 66 alternates the placement of reflectometer housing 58 above semiconductor substrate 52 with the placement of a polishing pad 68 above semiconductor substrate 52.

Polishing pad 68 is placed with a selected downward force against top surface 56 of film 54 and is rotated by a spindle 70 so as to abrade material from top surface 56 of film 54. Spindle 70 is controlled by a polisher drive and control circuitry 72. Control of this abrasive process is determined by reflectance data accumulated and processed electronically by circuitry within reflectometer control circuit housing 64. In this way, reflectance data can asses the degree to which film 54 is planarized by the abrasive polishing tool. A feedback loop is associated with the abrasive polishing tool so as to continue the planarizing process until such time that an end point is detected for the planarizing operation. Such a selected end point may be based upon the degree of planarity of top surface 56 of film 54, as well as the thickness of film 54 as assessed by the collected reflectance data.

Figure 6:
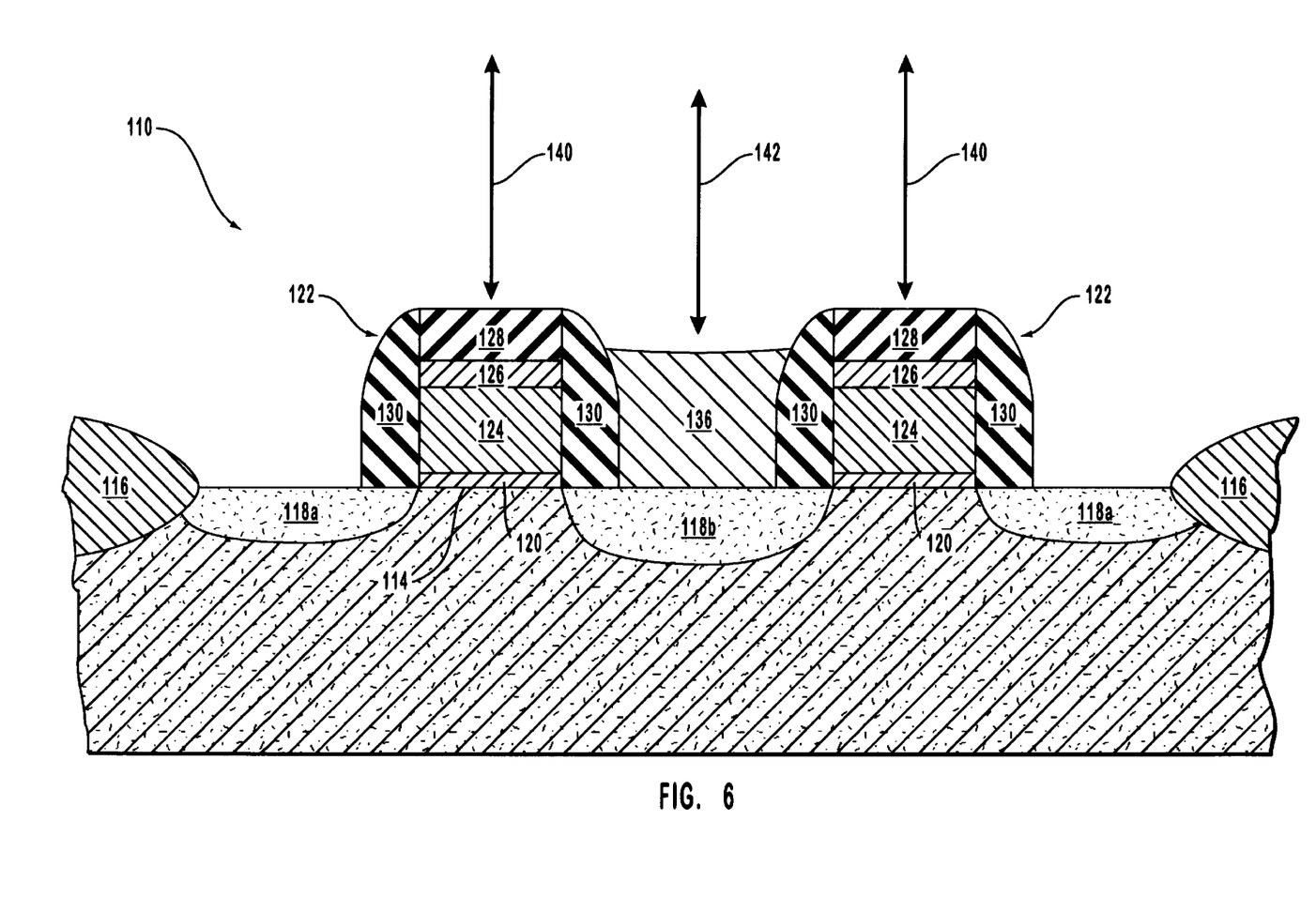
FIG. 6 is a cross sectional elevation view showing a surface of a semiconductor substrate having fabricated thereon electrical circuitry in the form of a dynamic random access memory cell in which the IRMT is used to detect a proper selective deposition of a preferred thickness of an electrically conductive material in the formation of a contact plug associated with two adjacent access transistors that are covered with an electrical insulation material.

Referring to FIG. 6, a dynamic random access memory (DRAM) device 110 is being formed in a fabrication process. The DRAM device is being formed upon a lightly doped P-type single crystal silicon substrate 112 which has been oxidized to form thin gate insulating layers 114 and thick field oxide regions 116. Impurities are implanted in the surface of substrate 112 to form N+ doped source/drain regions 118A and 118B for access transistors 120. Transistor gate electrodes 122 comprise a first doped polysilicon layer 124, a tungsten silicide layer 126 and gate insulating protective layer 128 formed on top of tungsten silicide layer 126. Insulating spacers 130 are formed on either side of transistor gate electrodes 122. Gate insulating protective layer 128 and insulating spacers 130 are preferably made of silicon dioxide. A polysilicon contact plug 136 is being formed between insulating spacers 130 of transistor gate electrodes 122 incident to a fabrication process.

Reflectometry can be used to monitor and control the fabrication of polysilicon contact plug 136 that is being formed on N+ doped source/drain region 118B within substrate 112. While polysilicon is formed into plug 136 on N+ doped source/drain region 118B, reflectance measurements are taken, as indicated by electromagnetic radiation beams 140 and 142, respectively, for a surface at the top of each transistor gate electrode 122 and for a surface at the top of polysilicon contact plug 136 being formed. The reflectance measurements from electromagnetic radiation beams 140 and 142 are used to detect whether polysilicon is being formed in a misaligned location at the top of each transistor gate electrode 122. Any polysilicon that was formed in an undesirable place can be detected by a variation from a bench mark reflectance detected at electromagnetic radiation beam 140 where silicon dioxide reflectance characteristics are expected.

As the formation of polysilicon contact plug 136 nears completion, reflectometer data is collected and compared to a selected standard reflectivity quantity at a most sensitive wavelength in accordance with the IRMT. This comparison is used to detect the end point of formation of polysilicon contact plug 136 by an assessment of a desirable thickness range of the polysilicon formed. As such, the selectivity of polysilicon being formed into polysilicon contact plug 136 can be assessed in real time.

It may be desirable in DRAM cells to fabricate associated container cell capacitor storage nodes that have a surface roughness given to the same. The surface roughness is achieved by a coating thereof with hemispherical grain polysilicon for the purpose of increasing surface area. A proper electrical isolation of storage node capacitor components is made by using an insulator, such as silicon dioxide The efficacy of this process can be monitored in real time by reflectometry. The IRMT can be used to detect the both presence and thickness of an insulator film that assures such isolation.

Detection of the presence of a certain film where desirable, and an absence of a certain film where undesirable can be used elsewhere in DRAM fabrication. To do so, the reflectometer is focused at various locations to determine, from reflectivity measurements, materials that are present or are not present. Variations from a norm indicate the presence of an undesirable material, be it grown or deposited. Once a diagnosis made, a determination as to a process to rectify the abnormality can be prescribed, for example a soft etch that will remove silicon dioxide film improperly situated in a misaligned position upon a storage node of a container cell capacitor.

Figure 7:
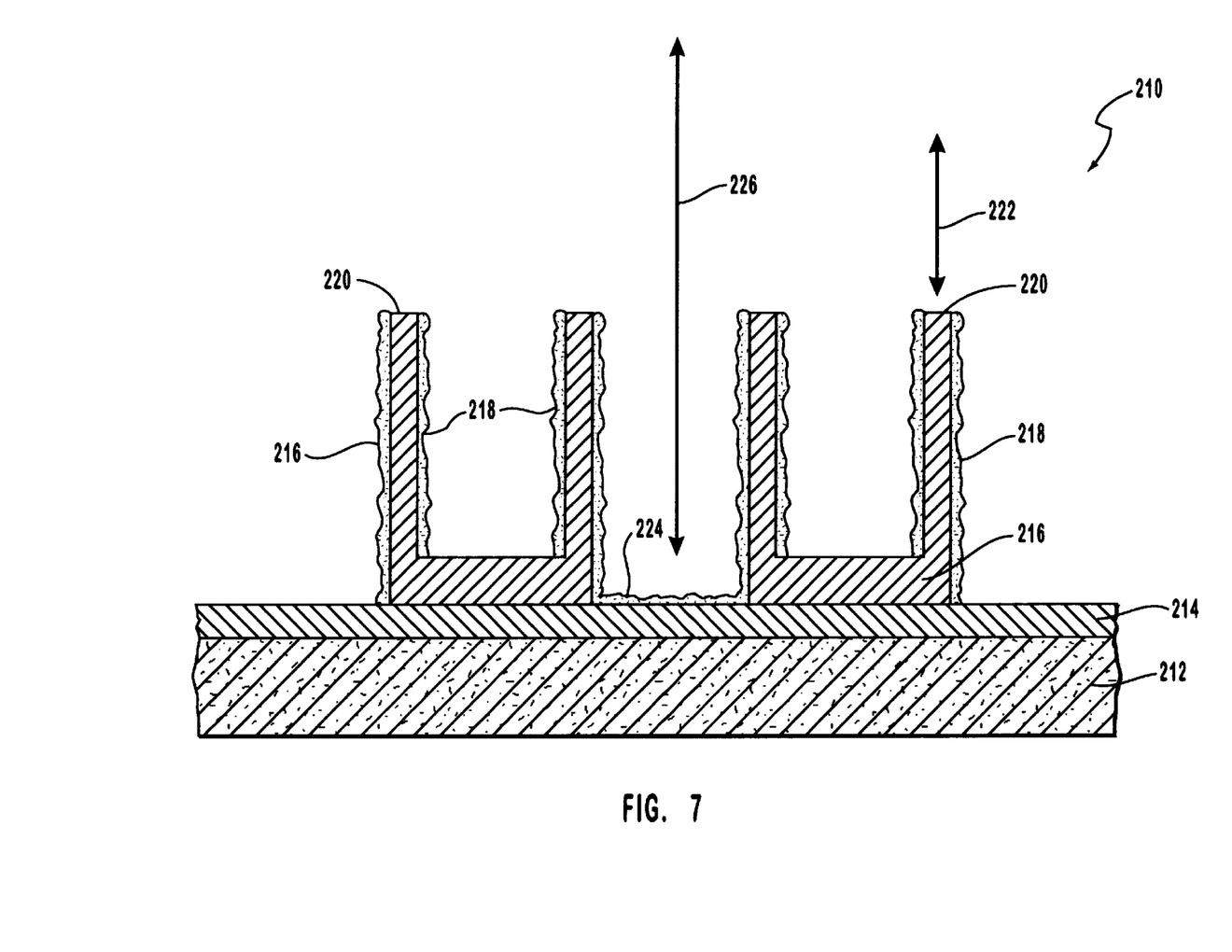
FIG. 7 is a cross sectional elevation view showing a surface of a semiconductor substrate upon which electrodes with roughed surfaces for container cell capacitors are being fabricated, where the electrodes are being subjected to a process of etching in which the IRMT is used to detect the end point of the etching process necessary to assure electrical isolation of one electrode from another.

By way of example of the foregoing film detection technique, FIG. 7 depicts a structure 210 that features a semiconductor substrate 212 upon which is situated an electrical insulation layer 214. A pair of electrodes 216 are situated upon electrical insulation layer 214. Electrodes 216 have the surface thereon roughened in certain locations by a deposition of a layer of hemispherical grain polysilicon 218. The electrode 216 has an exposed surface 220 thereon which is monitored as to reflectance therefrom by a reflectometer transreceiving an electromagnetic radiation beam 222.

Should the fabrication of structure 210 require the electrical isolation of electrodes 216 one from another, reflectance data can be accumulated and analyzed so as to verify the same. Particularly, should there be a presence of an electrical shorting material 224, substantially composed of electrically conductive hemispherical grain polysilicon, then a reflectometer transreceiving an electromagnetic radiation beam 226 can detect the presence of the same. Further control circuitry that processes the reflectance data can then produce a diagnostic which, when acted upon by automated processing machinery, would subject structure 210 to a soft etch process so as to remove electrical shorting material 224.

The result of a further transreceiving of electromagnetic radiation beam 226 would be the detection of the absence of material that would electrically connect the pair of electrodes 216, thus assuring the electrical insulation of electrodes 216 one from another as verified by the accumulated reflectance data. Additionally, a reflectometer transreceiving electromagnetic radiation beam 222 would be able to diagnose the effectiveness of a process for removing hemispherical grain polysilicon from horizontal surfaces of structure 210 such that reflectance data would be characteristic of the electrically conductive material from which electrode 216 is composed, as opposed to reflectance data indicative of the presence of hemispherical grain polysilicon.

The present invention contemplates the use of a reflectometer with the IRMT that is able to irradiate a small diameter on a surface of a semiconductor substrate. The surface is irradiated by a spot of light, visible or invisible, that can be generated by a laser. The surface so irradiated can be situated on a feature situated in a narrow area on the semiconductor substrate. As such, reflectance measurements can be taken for features having a particularly high aspect ratio. The diameter of the laser generated light spot can be as small as about 0.005 microns. Such a light spot will discretely illuminate an area of about $2 \times 10^{-5}$ microns$^2$ on a surface of a semiconductor substrate. Preferably, reflectometers will includes a laser that produces an electromagnetic radiation beam that irradiates an area on a surface of a semiconductor substrate that has a diameter in range from about 0.005 microns to about 0.018 microns. Such a surface can be situated at the bottom of a feature, such as a contact hole, having as aspect ratio of 6.0 or greater. As such, the light spot from the laser used with the IRMT can be made smaller than the smallest feature that is situated on the semiconductor substrate. Surface properties of surfaces within high aspect ratio features can be assessed by a reflectometer using an appropriately sized light spot.

An example of the foregoing small feature analysis using the IRMT is seen in FIG. 7. Should the distance between electrodes 216 be small as compared to photolithographic resolution limits, a reflectometer having a laser producing either of electromagnetic radiation beams 222, 226 can irradiate an area that is even smaller than the distance between electrodes 216. As such, the small feature size of the space between electrodes 216 does not present a problem as the irradiated area produced by electromagnetic radiation beam 226 can be made smaller still. Given the foregoing, lasers generating electromagnetic radiation prove to be adequate for even small feature sizes and the analysis of same through the accumulation of reflectance data and subjection to the IRMT.

The small light spot from the laser of the reflectometer can be used to detect surface roughness. The topography of a semiconductor substrate may be rugged with the peaks thereof ranging from about 100 Å to about 2000 Å that are situated upon an underlying planar surface. This rugged surface can be due to a prior trench fill operation, or it can be due to a deposition of HSG polysilicon.

The IRMT is used with a small laser light spot to measure surface properties of small features such as a small oxide feature or a single grain of material. A reflectometer is used to is analyze reflectance data collected at the most sensitive wavelength in order to assess, for example, the surface roughness of a planar surface having rough grained material thereon such as hemispherical grain or spherical grain polysilicon. FIG. 7 shows an example of the IRMT as applied to measurement of grain size, wherein electromagnetic radiation beam 226 can be used to accumulate reflectance data from electrical shorting material 224 so as to diagnose therefrom the grain size of the hemispherical grain polysilicon from which it is substantially composed.

As device features are continually miniaturized, it is contemplated that the irradiated area will correspondingly decreases as to reflectometers using electromagnetic radiation produced using the IRMT. As such, the IRMT as taught herein can used with a variety of the known and to be known spectrum of electromagnetic radiation (EMR). Such uses of EMR are limited substantially only to EMR that will reflect or will refract at a selected most sensitive wavelength, respectively, from or through a given material being subjected to the IRMT. While the IRMT has been illustrated in some of the drawings of the present application as being a measurement of reflected EMR, its is intended that the IRMT be understand to encompass both reflected and refracted EMR. As an extension of the quantum mechanic principles of the duality of EMR and characteristics thereof as both a particle and a wave, uses of the IRMT are contemplated using both wave and particle characteristics of EMR as is required to monitor the fabrication of atomic sized device features.

What has been described are several possible physical embodiments incorporating the invention. Variations to the described designs, and entirely different designs using other and substitute components, could be employed to practice the invention.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of measuring a selected surface property of a surface of a semiconductor substrate, the method comprising:

directing electromagnetic radiation having a plurality of selected wavelengths to a surface of a test semiconductor substrate, where a selected surface property of the surface of the test semiconductor substrate is known;

measuring the quantity and variation thereof of electromagnetic radiation at each of the selected wavelengths that is reflected off the surface of the test semiconductor substrate;

determining a target wavelength from among the plurality of selected wavelengths that has substantially the highest the change in the ratio of reflected electromagnetic radiation off the surface of the test semiconductor substrate divided by incident electromagnetic radiation to the surface of the test semiconductor substrate;

directing electromagnetic radiation at the target wavelength to a surface of a production semiconductor substrate for which the selected surface property is unknown;

measuring the quantity of electromagnetic radiation at the target wavelength that is reflected off the surface of the production semiconductor substrate; and determining the selected surface property for the surface of the production semiconductor substrate when the numerical difference between the measured quantity of electromagnetic radiation at the target wavelength that is reflected off the surface of the test semiconductor substrate and the measured quantity of electromagnetic radiation at the target wavelength that is reflected off the surface of the production semiconductor substrate is within a selected numerical range.

2. The method as defined in claim 1, wherein the selected surface property for the surface of the production semiconductor substrate is the thickness of a film beneath the surface of the production semiconductor substrate.

3. The method as defined in claim 1, wherein the selected surface property for the surface of the production semiconductor substrate is the material of which the surface of the production semiconductor substrate is substantially composed.

4. The method as defined in claim 1, wherein the selected surface property for the surface of the production semiconductor substrate is a grain size of the material of which the surface of the production semiconductor substrate is substantially composed.

5. The method as defined in claim 1, where the electromagnetic radiation directed at the target wavelength to the surface of the production semiconductor substrate is an electromagnetic radiation beam that irradiates an area on the surface of the production semiconductor substrate that has a diameter within range from about 0.005 microns to about 0.018 microns.

6. A method of measuring a selected surface property of a surface of a semiconductor substrate, the method comprising:

directing electromagnetic radiation having a plurality of selected wavelengths from each of a plurality of slave reflectometers to a respect slave area on a surface of a test semiconductor substrate, where a selected surface property of the surface of the test semiconductor substrate is known;

measuring the quantity and variation thereof of electromagnetic radiation at each of the selected wavelengths that is reflected off the respective slave areas of the surface of the test semiconductor substrate from each of the plurality of slave reflectometers, each said slave reflectometers communicating the respective measured quantity and variation thereof of electromagnetic radiation at each of the selected wavelengths to as signal data to a master data channel;

receiving said signal data from the master data channel communicated by said plurality of slave reflectometers, and for each of said slave areas:

determining a target wavelength from among the plurality of selected wavelengths that has substantially the highest the change in the ratio of reflected electromagnetic radiation off the slave area of surface of the test semiconductor substrate divided by incident electromagnetic radiation to the slave area of the surface of the test semiconductor substrate;

directing electromagnetic radiation at the target wavelength for each respective slave reflectometer to a respective slave area of a surface of a production semiconductor substrate for which the selected surface property is unknown;

measuring the quantity of electromagnetic radiation at the target wavelength that is reflected off the respective slave area of the surface of the production semiconductor substrate from the respective slave reflectometer of the plurality of slave reflectometers, each said slave reflectometers communicating the respective measured quantity of reflected electromagnetic radiation at the target wavelength for each respective slave area as signal data to a master data channel;

receiving said signal data from the master data channel communicated by said plurality of slave reflectometers, and determining with the selected surface property for each said slave areas of the surface of the production semiconductor substrate when the numerical difference between a selected target amount and the signal data from the master data channel communicated by said plurality of slave reflectometers is within a selected master numerical range.

7. The method as defined in claim 6, wherein the selected surface property for the surface of both the test and production semiconductor substrates is the thickness of a film, respectively, beneath the surface of both the test and production semiconductor substrates.

8. The method as defined in claim 6, wherein the selected surface property for the surface of both the test and production semiconductor substrates is the material of which, respectively, the surface of both the test and production semiconductor substrates is substantially composed.

9. The method as defined in claim 6, wherein at least one of said plurality of slave reflectometers produces an electromagnetic radiation beam that irradiates an area having a diameter within a range from about 0.005 microns to about 0.018 microns.

10. An apparatus for determining a selected surface property of a surface on a semiconductor substrate, said apparatus comprising:

a plurality of slave reflectometers for each performing a slave reflectometer process comprising:
  directing electromagnetic radiation at a target wavelength to a slave area on the surface of the semiconductor substrate for which a selected surface property is unknown;
  measuring the quantity of electromagnetic radiation at the target wavelength that is reflected off the slave area on the surface of the semiconductor substrate, and communicating same as signal data to a master data channel; and determining the selected surface property for each of the slave areas on the surface of the semiconductor substrate from said signal data from the master data channel communicated by said plurality of slave reflectometers when the numerical difference between a selected target amount and the signal data from the master data channel communicated by said plurality of slave reflectometers is within a selected master numerical range.

11. The apparatus as defined in claim 10, wherein the selected surface property for the surface of the semiconductor substrate is the thickness of a film beneath the surface of the semiconductor substrate.

12. The apparatus as defined in claim 10, wherein the selected surface property for the surface of the semiconductor substrate is the material of which the surface of the semiconductor substrate is substantially composed.

13. The apparatus as defined in claim 10, wherein at least one of said plurality of slave reflectometers produces an electromagnetic radiation beam that irradiates an area on the surface of the semiconductor substrate that has a diameter within range from about 0.005 microns to about 0.018 microns.

14. A method of forming a contact plug comprising:

forming an electrically conductive material on a semiconductor substrate, said electrically conductive material being formed in between and adjacent to a pair of raised structures on the semiconductor substrate;

directing electromagnetic radiation at a target first wavelength towards an area adjacent to the electrically active area where a top surface of each of the raised structures is desired to be situated;

measuring the quantity and variation thereof of electromagnetic radiation at the target first wavelength that is reflected, determining the selected first surface property for a surface from which the electromagnetic radiation at the target first wavelength was reflected when the numerical difference between a target first amount and the quantity of electromagnetic radiation at the target first wavelength that was reflected is within a selected first numerical range;

directing electromagnetic radiation at a target second wavelength towards the electrically active area where a top surface of the electrically conductive material is desired to be situated;

measuring the quantity of electromagnetic radiation at the second target wavelength that is reflected; and determining the selected second surface property for a surface from which the electromagnetic radiation at the second target wavelength was reflected when the numerical difference between a target second amount and the quantity of electromagnetic radiation at the target second wavelength that was reflected is within a selected second numerical range.

15. The method as defined in claim 14, wherein the selected first and second surface properties are, respectively, the material of which the top surface of the raised structures are substantially composed, and the material of which the top surface of the electrically conductive material is substantially composed.

16. The method as defined in claim 15, wherein the material of which the top surface of the raised structures are substantially composed is selected from a group consisting of silicon dioxide and silicon nitride, and wherein the material of which the top surface of the electrically conductive material is substantially composed is selected from a group consisting of polysilicon, hemispherical grain polysilicon, and spherical grain polysilicon.

17. The method as defined in claim 14, wherein the selected second surface property for the top surface of the electrically conductive material is a grain size of the electrically conductive material.

18. The method as defined in claim 14, wherein each said raised structures is an electrode and the electrically conductive material is formed upon said raised structures.

19. The method as defined in claim 15, wherein each said raised structures is adjacent to an electrically active area and is an insulated transistor gate stack, and the electrically conductive material is a contact plug that is situated on the electrically active area within the semiconductor substrate.

20. The method as defined in claim 14, wherein the selected second surface properties is the thickness of the electrically conductive material.

21. The method as defined in claim 14, where the electromagnetic radiation directed at at least one of the first and second target wavelengths is an electromagnetic radiation beam that irradiates an area that has a diameter within range from about 0.005 microns to about 0.018 microns.

22. A method of measuring a selected surface property of a surface of a semiconductor substrate, the method comprising:

directing electromagnetic radiation having a plurality of selected wavelengths to a surface of a test semiconductor substrate, where a selected surface property of the surface of the test semiconductor substrate is known;

measuring the quantity and variation thereof of electromagnetic radiation at each of the selected wavelengths that is refracted from the surface of the test semiconductor substrate;

determining a target wavelength from among the plurality of selected wavelengths that has substantially the highest the change in the ratio of refracted electromagnetic radiation off the surface of the test semiconductor substrate divided by incident electromagnetic radiation to the surface of the test semiconductor substrate;

directing electromagnetic radiation at the target wavelength to a surface of a production semiconductor substrate for which the selected surface property is unknown;

measuring the quantity of electromagnetic radiation at the target wavelength that is refracted from the surface of the production semiconductor substrate; and determining the selected surface property for the surface of the production semiconductor substrate when the numerical difference between the measured quantity of electromagnetic radiation at the target wavelength that is refracted from the surface of the test semiconductor substrate and the measured quantity of electromagnetic radiation at the target wavelength that is refracted from the surface of the production semiconductor substrate is within a selected numerical range.

23. A method of measuring a selected surface property of a surface of a semiconductor substrate, the method comprising:

directing electromagnetic radiation having a plurality of selected wavelengths to a surface of a test semiconductor substrate, where a selected surface property of the surface of the test semiconductor substrate is known;

measuring the quantity and variation thereof of electromagnetic radiation at each of the selected wavelengths that is reflected or refracted from the surface of the test semiconductor substrate;

determining a target wavelength from among the plurality of selected wavelengths that has substantially the highest the change in the ratio of reflected or refracted electromagnetic radiation off the surface of the test semiconductor substrate divided by incident electromagnetic radiation to the surface of the test semiconductor substrate;

directing electromagnetic radiation at the target wavelength to a surface of a production semiconductor substrate for which the selected surface property is unknown;

measuring the quantity of electromagnetic radiation at the target wavelength that is reflected or refracted from the surface of the production semiconductor substrate; and determining the selected surface property for the surface of the production semiconductor substrate when the numerical difference between the measured quantity of electromagnetic radiation at the target wavelength that is reflected or refracted from the surface of the test semiconductor substrate and the measured quantity of electromagnetic radiation at the target wavelength that is reflected or refracted from the surface of the semiconductor substrate is within a selected numerical range.

\* \* \* \* \*

UNITED STATES PATENT AND TRADEMARK OFFICE
CERTIFICATE OF CORRECTION

PATENT NO. : 5,835,225
DATED : 11/10/98
INVENTOR(S) : Randhir P. S. Thakur

It is certified that error appears in the above-identified patent and that said Letters Patent are hereby corrected as shown below:

Figure 1, item 104, after "SURFACE" change "ATA" to --AT A--

Col. 1, line 5, before "Ser. No." change "patent application" to "Patent Application"

Col. 5, line 27, before "EMR" change "a" to --an--

Col. 6, line 50, after "from a" change "surfacc" to --surface--

Col. 9, line 41, after "dioxide" insert a period

Col. 9, line 53, after "diagnosis" add --is--

Col. 10, line 38, before "a laser" change "includes" to --include--

Col. 15, line 7, after "within" add --a--

Signed and Sealed this

Fourteenth Day of September, 1999

*Attest:*

Q. TODD DICKINSON

*Attesting Officer*     *Acting Commissioner of Patents and Trademarks*